(12) United States Patent
Song et al.

(10) Patent No.: US 8,647,976 B2
(45) Date of Patent: Feb. 11, 2014

(54) SEMICONDUCTOR PACKAGE HAVING TEST PADS ON TOP AND BOTTOM SUBSTRATE SURFACES AND METHOD OF TESTING SAME

(75) Inventors: Eun-seok Song, Gwanak-gu (KR); Dong-han Kim, Osan-si (KR); Hee-seok Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 154 days.

(21) Appl. No.: 13/348,767

(22) Filed: Jan. 12, 2012

(65) Prior Publication Data

US 2012/0105089 A1    May 3, 2012

Related U.S. Application Data

(62) Division of application No. 11/758,176, filed on Jun. 5, 2007, now Pat. No. 8,120,024.

(30) Foreign Application Priority Data

Sep. 6, 2006  (KR) .................. 10-2006-0085885

(51) Int. Cl.
*H01L 21/4763* (2006.01)

(52) U.S. Cl.
USPC ........... 438/618; 438/666; 438/650; 438/651; 257/773; 257/737; 257/E23.001; 324/755.05; 324/762.02; 324/755.11

(58) Field of Classification Search
USPC ............... 257/783, 48, 690, 773, 692, 737, 257/E23.001; 438/650, 651, 618, 666; 324/765, 754, 761, 755.05, 762.02, 324/755.11
See application file for complete search history.

(56) References Cited

U.S. PATENT DOCUMENTS

| | | | |
|---|---|---|---|
| 5,049,813 A | | 9/1991 | Van Loan et al. |
| 5,150,041 A | * | 9/1992 | Eastin et al. ............. 324/750.23 |
| 5,334,857 A | * | 8/1994 | Mennitt et al. .................. 257/48 |
| 6,759,860 B1 | * | 7/2004 | Hsiung et al. ............ 324/750.19 |
| 7,235,412 B1 | * | 6/2007 | Mardi et al. ..................... 438/14 |
| 7,262,615 B2 | * | 8/2007 | Cheng et al. ............. 324/756.05 |
| 7,323,773 B2 | * | 1/2008 | Hayashi et al. ................ 257/698 |
| 7,598,756 B2 | * | 10/2009 | Inoue et al. ............. 324/754.03 |
| 2006/0060959 A1 | * | 3/2006 | Hayashi et al. ................ 257/697 |

FOREIGN PATENT DOCUMENTS

| | | |
|---|---|---|
| JP | 06222109 | 8/1994 |
| JP | 10012809 | 1/1998 |
| JP | 2006093189 | 4/2006 |
| KR | 1020040029505 A | 4/2004 |

* cited by examiner

*Primary Examiner* — Thinh Nguyen

(74) *Attorney, Agent, or Firm* — Volentine & Whitt, PLLC

(57) ABSTRACT

A semiconductor package and testing method is disclosed. The package includes a substrate having top and bottom surfaces, a semiconductor chip mounted in a centrally located semiconductor chip mounting area of the substrate, and a plurality of test pads disposed on top and bottom surfaces of the substrate and comprising a first group of test pads configured on the top and bottom surfaces of the substrate and having a first height above the respective top and bottom surface of the substrate, and a second group of test pads disposed on the lower surface of the substrate and having a second height greater than the first, wherein each one of the second group of test pads includes a solder ball attached thereto.

8 Claims, 6 Drawing Sheets

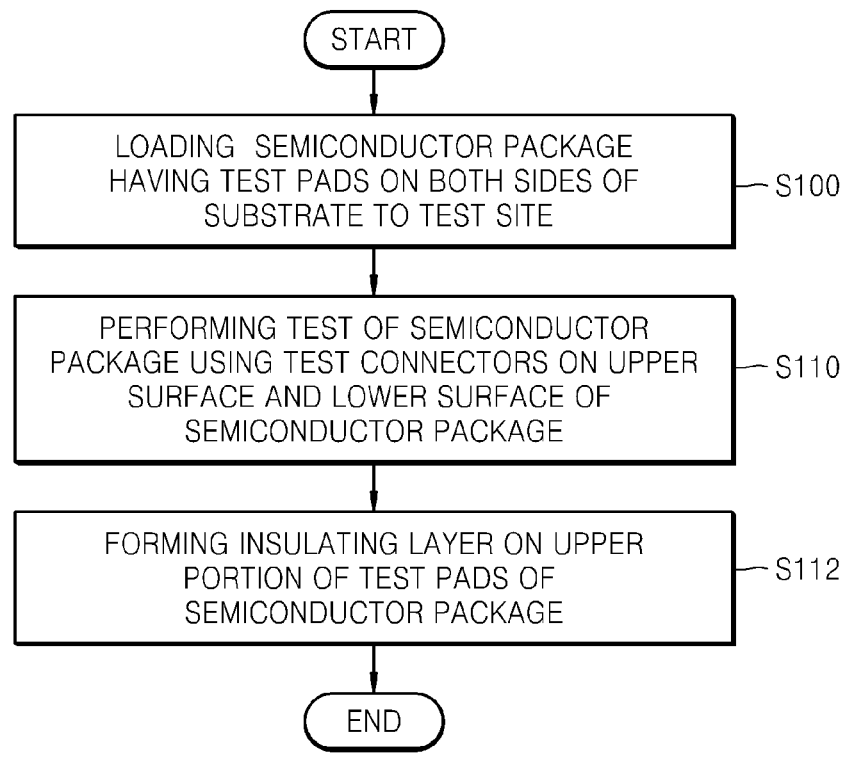
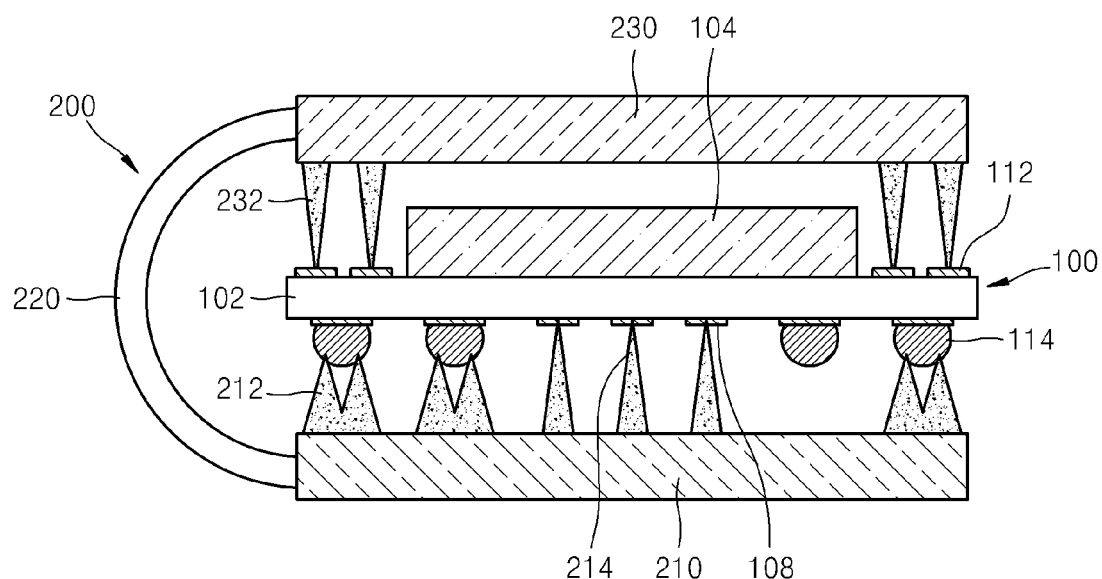

SEMICONDUCTOR PACKAGE HAVING TEST PADS ON TOP AND BOTTOM SUBSTRATE SURFACES AND METHOD OF TESTING SAME

CROSS-REFERENCE TO RELATED PATENT APPLICATION

This application is a Divisional of application Ser. No. 11/758,176, filed Jun. 5, 2007, which issued as U.S. Pat. No. 8,120,024, on Feb. 21, 2012, and which claims the benefit of Korean Patent Application No. 10-2006-0085885, filed on Sep. 6, 2006, the subject matter of which is hereby incorporated by reference.

BACKGROUND OF THE INVENTION

1. Field of the Invention

The present invention relates to a semiconductor package and a method of testing the semiconductor package. More particularly, the invention relates to a semiconductor package having a plurality of test pads disposed on the top and bottom surfaces of a substrate and a related method of testing the semiconductor package.

2. Description of the Related Art

The recent evolution of integrated semiconductor packages is one characterized by increasing size. Contemporary packages include structures that allow multiple semiconductor chips or multiple semiconductor (sub-)packages to be mounted within a single package. So-called system in package (SIP) or package on package (POP) devices are examples of this evolution.

The incorporation of multiple semiconductor dies or multiple semiconductor packages within a single package has, up until now, necessarily resulted in an increase in the overall size of the semiconductor package. However, this outcome runs counter to the commercial trend of supplying increasingly sophisticated consumer electronics with increasingly small sizes. In order to satisfy the demand for smaller overall products, the size of constituent semiconductor package(s) must decrease.

A principal driver in the conventional expansion of semiconductor packages is an increasing need for connection pads (or terminals). Terminals are often implemented by the provision of numerous solder balls in the semiconductor package such as the SIP or POP. Unfortunately, the resulting layout of solder balls and related collection of connection paths occupy a relatively large amount of space on a substrate implementing the package. As a result, numerous design efforts and fabrication experiments have been directed to the development of efficient layouts for connection terminals. Such efforts seek to facilitate the ongoing trend of overall product miniaturization.

FIG. 1 is a bottom view of a typical semiconductor package including a layout of solder balls facilitating connection of various signals. In the illustrated example, a 9×9 array of solder balls is disposed on the bottom surface of a substrate 10 supporting a semiconductor package 1. Among the array solder balls, a first class of solder balls 12 are intended for user defined purposes (e.g., signal connection). A second class of solder balls 14 are provided to allow testing of the semiconductor package during manufacture. Such "test only" solder balls 14, which are only used during manufacture of the semiconductor package, are thereafter labeled, 'No connection or NC". Nearly all contemporary semiconductor packages include test only-related solder balls.

In addition to testing connections made through test only solder balls, semiconductor packages are also connected to a tester through a needle-like probe or so-called POGO pin. Certain basic functions of the circuits contained within the semiconductor package may be readily tested via these types of external probe testing methods. Whether a testing connection is made through a test only solder ball or an external probe, conventional semiconductor packages routinely provide such connections on only a single surface of the package, e.g., a bottom surface of a substrate supporting the package.

Unfortunately, this conventional approach to test connection provision is becoming increasingly inadequate as the corresponding number of solder balls and connection pads continues to increase. Indeed efforts to decrease the size of the substrate and the overall semiconductor package are being defeated by the need for more test connections. This problem is becoming particularly acute in relation to the development of SIPs and POPs, including two or more semiconductor chips.

SUMMARY OF THE INVENTION

Embodiments of the invention provide a semiconductor package having test pads on both top and bottom surfaces of a substrate supporting a semiconductor package.

In one embodiment, the invention provides a semiconductor package, comprising; a substrate having top and bottom surfaces, a semiconductor chip mounted in a centrally located semiconductor chip mounting area of the substrate, and a plurality of test pads disposed on top and bottom surfaces of the substrate and comprising a first group of test pads disposed on the top and bottom surfaces of the substrate and having a first height above the respective top and bottom surfaces of the substrate, and a second group of test pads disposed on the lower surface of the substrate and having a second height greater than the first, wherein each one of the second group of test pads includes a solder ball attached thereto.

In another embodiment, the invention provides a method of testing a semiconductor package, wherein the semiconductor package comprises a substrate having top and bottom surfaces, a semiconductor chip mounted in a centrally located semiconductor chip mounting area of the substrate, and a plurality of test pads disposed on top and bottom surfaces of the substrate and comprising a first group of test pads configured on the top and bottom surfaces of the substrate and having a first height above the respective top and bottom surfaces of the substrate, and a second group of test pads disposed on the lower surface of the substrate and having a second height greater than the first, wherein each one of the second group of test pads includes a solder ball attached thereto. The method comprises; loading the semiconductor package into a tester, and performing electrical/functional testing of the semiconductor package using a test connector simultaneously connected to the plurality of test pads.

BRIEF DESCRIPTION OF THE DRAWINGS

Several embodiments of the invention will now be described with reference to the attached drawings in which:

FIG. 6 is a flow chart summarizing a method of testing a semiconductor package having test pads on both surfaces of a substrate according to an embodiment of the invention;

FIG. 7 is a sectional view illustrating a method of testing a semiconductor package having test pads on both surfaces of a substrate using a probe test connection according to an embodiment of the invention.

DESCRIPTION OF EMBODIMENTS

Embodiments of the invention will now be described in some additional detail with reference to the accompanying drawings. This invention may, however, be embodied in many different forms and should not be construed as being limited to only the illustrated embodiments. Rather, these embodiments are presented as teaching examples.

Figure 2:
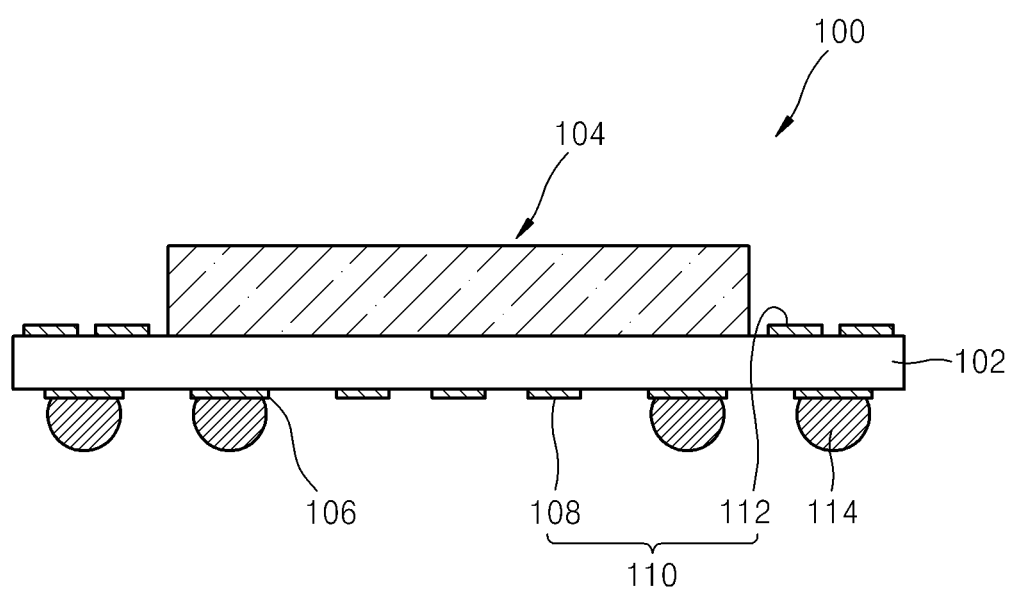
FIG. 2 is a sectional view of a semiconductor package having test pads on both surfaces of a substrate according to an embodiment of the invention.

FIG. 2 is a sectional view of a semiconductor package having test pads on both surfaces of a substrate according to an embodiment of the invention. In the illustrated example, a semiconductor package 100 having test pads on both surfaces of a constituent substrate 102 which serves as a base frame for the package 100. Semiconductor chips (not shown) are mounted on substrate 102, and corresponding printed circuit patterns (not shown) are disposed on substrate 102. Preferably, substrate 102 is a rigid substrate capable of supporting multi-layered printed circuit patterns. Alternatively, substrate 102 may use a flexible substrate, such as those conventionally formed from polyimide.

Further, package 100 comprises a semiconductor chip mounting area 116 which is defined within the area 104 on the top surface of substrate 102. The one or more semiconductor chips may be mounted in this area using an adhesive and may be electrically connected to substrate 102 using (e.g.,) a flip chip, wire bonding, solder bump or similar bonding method. When one or more semiconductor chips are connected to substrate 102 by a flip chip bonding method, for example, an under-fill using a resin compound may be selectively made between substrate 102 and mounted semiconductor chip.

The number of semiconductor chips mounted by semiconductor chip mounting part 116 may vary from one to many. For example, a plurality of semiconductor devices such as SIP or POP may be vertically or horizontally mounted by semiconductor chip mounting part 116. The shape, nature and number of mounted semiconductor chips may vary across a range of embodiments for the present invention. Further, a sealing resin adapted to protect semiconductor chip(s), bonding wires, and portions of substrate 102 may or may not be associated with semiconductor chip mounting part 116 or the peripheral portions of area 104 exposed beyond area 116.

Further, package 100 comprises multiple test pads 110 disposed respectively on a top and lower surface of substrate 102. Each test pad 110 in this context is a test pad associated with electrical testing of the circuits contained within package 100. Other connection elements strictly associated with end user connections are not included within the following discussion of "test pads".

In the illustrated embodiment of the invention, a first group of test pads 110 are disposed with a size sufficient to receive a subsequently added solder ball 106. This size is however smaller in size than a solder ball. A second group of test pads 110 may be disposed with a similar size, but do not receive a solder ball. Multiple test pads 110 of either group may be respectively disposed on both surfaces of substrate 102.

Figure 1:
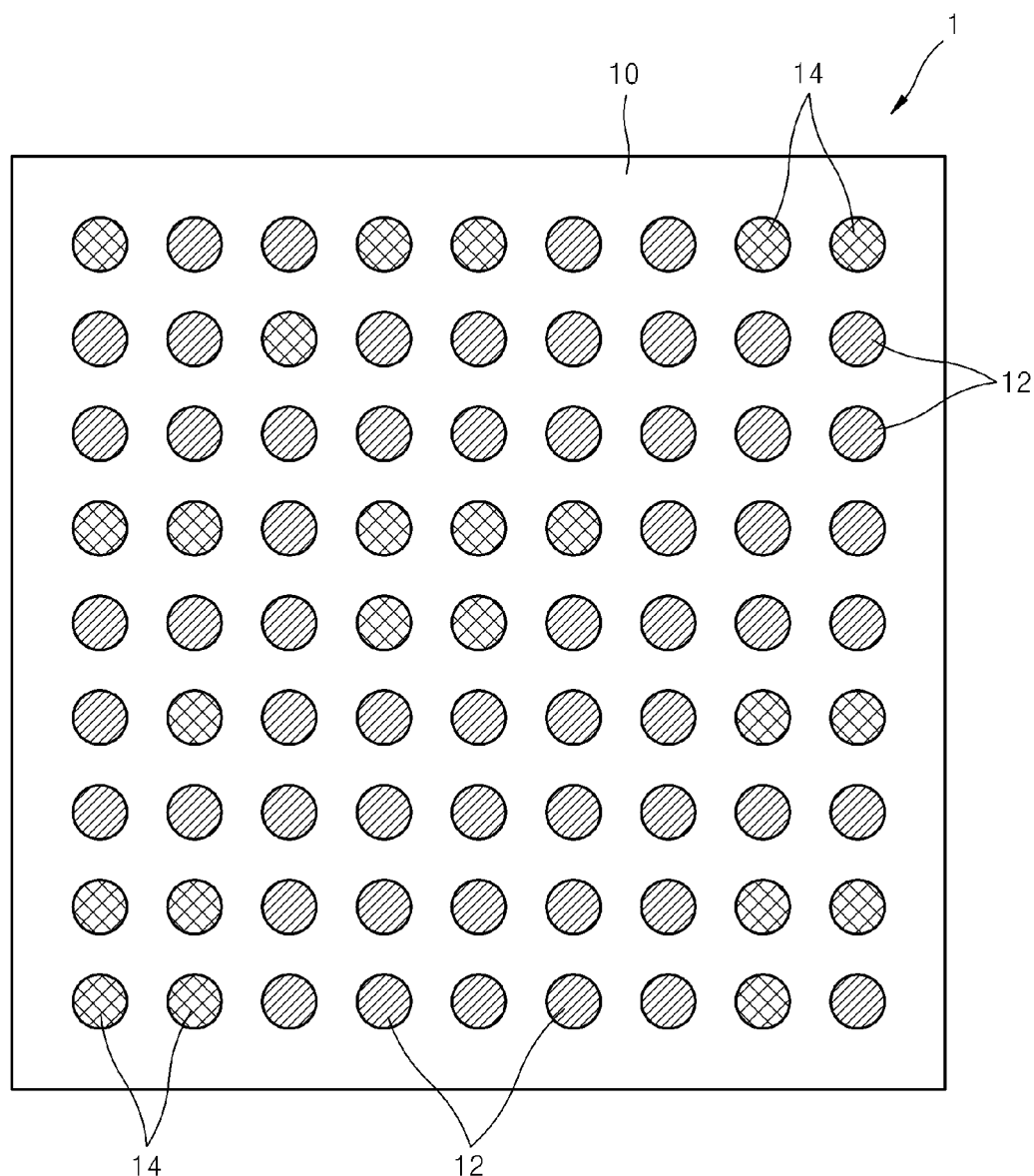
FIG. 1 is a bottom view of a conventional semiconductor package including an array of solder balls.

Thus, the number of attached solder balls may be greater than the number of test pads 110. For example, the number of solder balls and number of test pads disposed on the bottom surface of substrate 10 in FIG. 1 are both equal to 81. However, referring to FIG. 5, the respective groups of test pads 108A, 108B, and 108C may be disposed on the bottom surface of substrate 102 in respective sub-groups occupying an area conventionally allowing 1 or 2 solder balls.

Figure 3:
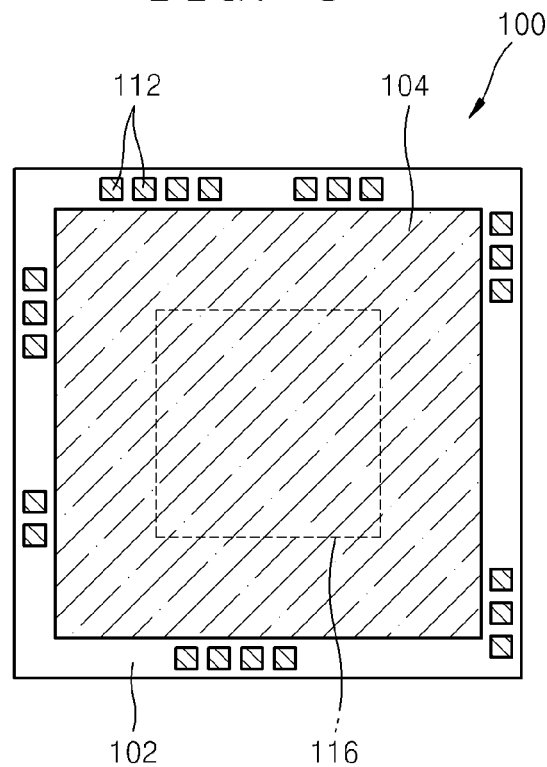
FIG. 3 is a plan view of the semiconductor package of FIG. 2.

As illustrated in FIG. 3, when test pads 112 are disposed on the peripheral edge of substrate 102, the number of the solder balls in an array filling the bottom surface of substrate 102 must be reduced. In FIG. 3, the conventional 9×9 array of FIG. 1 is replaced by an 8×8 array and a peripheral collection of test pads disposed around the edge of substrate 102. Although the number of test pads receiving solder balls in the structure (e.g., a SIP or POP) of FIG. 3 decreases, the overall number of test pads available to implement test terminals actually increases. Further, the reduced demand for substrate area necessary to test pads allows reduction in the size of substrate 102.

Following electrical testing of the package 100, some test pads 110 may be covered by an applied insulating layer (not shown). This insulating layer (e.g., a photo solder resist (PSR)) is applied to prevent the formation of short circuits between neighboring test pads 110. The formation of the insulating layer on selected test pads 110 may be facilitated by considering height differences apparent in the elements contained within package 100 and the viscosity of one or more applied insulating material(s) (e.g., PSR). More particularly, the first group of test pads (e.g., 108 or 112 in FIG. 2) having a first vertical height above the respective substrate surface may be covered using an insulating material of relatively low viscosity. The second group of test pads (e.g., 106 in FIG. 2) having an attached solder ball and therefore a second height, greater than the first height, above the respective substrate is not completely covered by the applied insulating material(s). That is, a portion of solder balls 114 extending above the surface of substrate 102 remains uncovered by the insulating material(s). However, the solder balls of the second group of test pads may be effectively fixed by curing the applied insulating material(s).

The nature, formation and composition of test pads 110 may be conventional. Further the nature, formation and composition of solder ball 114 attached to the second group of test pads 106 may also be conventional. Alternately, package 100 may be similarly implemented using conventional solder bumping techniques, instead of solder ball techniques. Whatever technique is used, the overall number of solder balls or solder bumps may be reduced over the conventional approach.

Figure 4:
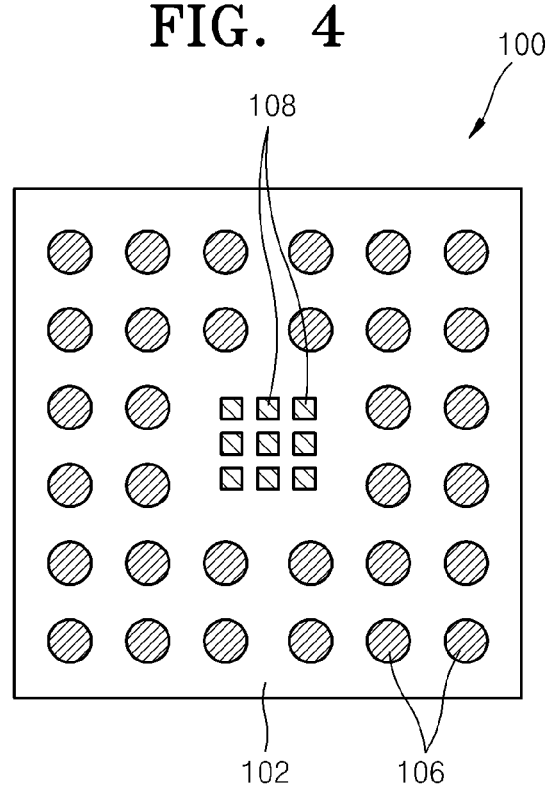
FIG. 4 is a bottom view of the semiconductor package of FIG. 2.
Figure 5:
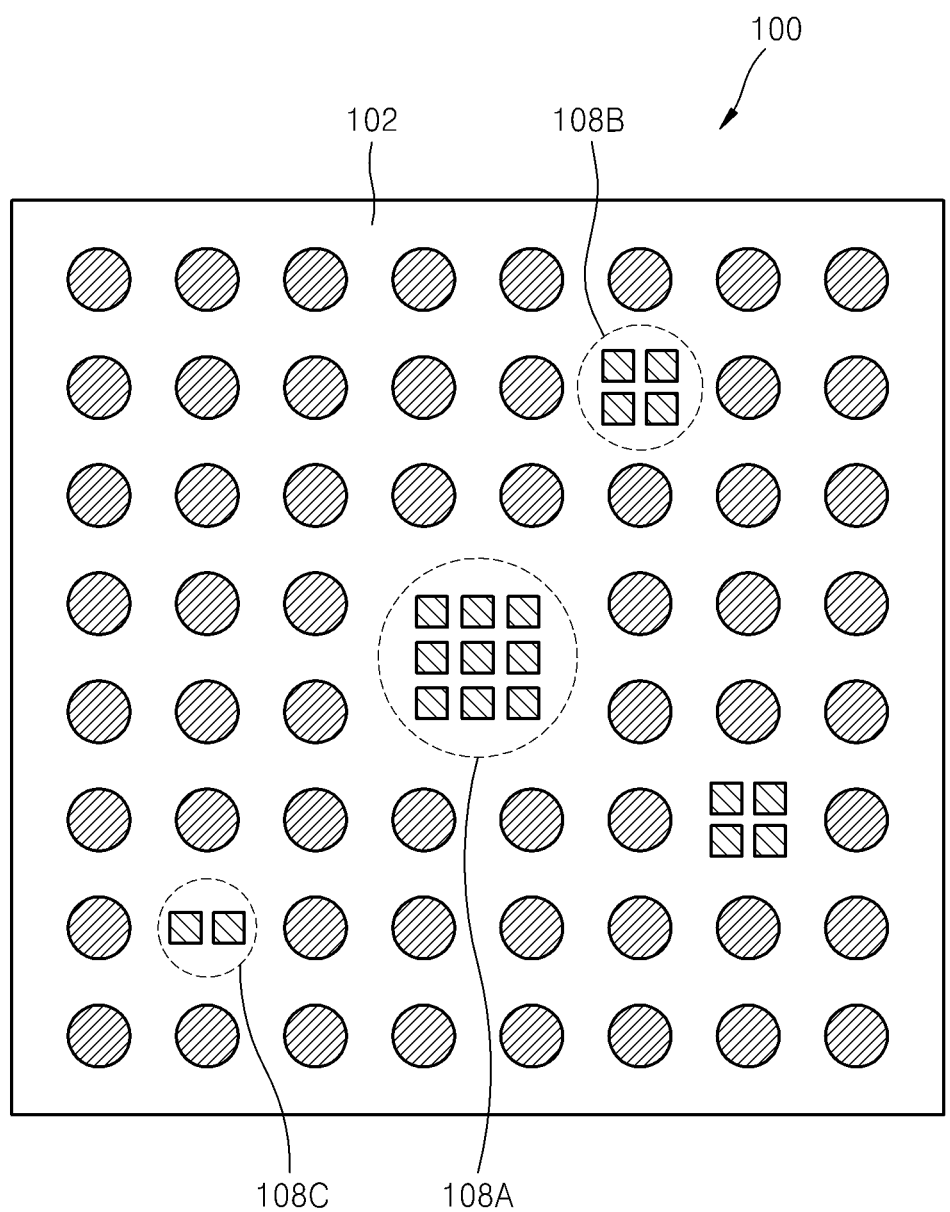
FIG. 5 is another bottom view of the semiconductor package of FIG. 2.

FIG. 3 is a plan view of the semiconductor package of FIG. 2, FIG. 4 is a bottom view of the semiconductor package of FIG. 2, and FIG. 5 is another bottom view of the semiconductor package of FIG. 2.

Referring to FIGS. 3 through 5, semiconductor chip mounting part 104 is positioned on the top surface of substrate 102. One or more semiconductor chip(s) may be mounted in centrally located semiconductor chip mounting area 116 of area 104. The combined area required to mount the one or more semiconductor chips on semiconductor chip mounting part 116 will be smaller than the available substrate area 104. A peripheral portion of substrate area 104 exposed beyond semiconductor chip mounting part 116 may be used for connections (e.g., wiring bonding) between the mounted semiconductor chips and related electrical connections, including test pads 110.

As shown in the illustrated example, multiple peripheral grouping 112 of test pads 110 are provided in this peripheral portion of substrate 102. In contrast, the conventional approach provides test pads 110 and/or test pad groupings 112 only on the bottom surface of substrate 102. As the demand for additional test pads 110 rises, the conventional approach inevitably leads to an expansion in the size of substrate 102. However, the illustrated embodiment of the invention provides multiple test pads 110, some optionally arranged in groups of test pads 112 on the top surface of substrate 102. This allows the overall size of substrate 102 to be smaller for a given number of test pad connections.

Further, as shown in FIG. 4, groups of first test pads 108 may be provided on the bottom surface of substrate 102. According to the illustrated embodiment of the invention, a size of (i.e., area occupied by) each respective test pad 108 disposed on the bottom surface of substrate 102 may be notably smaller than the size of a second test pad 106 having a solder ball or solder bump attached thereto. Thus, the area of substrate 102 may be more effectively used during the layout and provision test pads 110, including both first (108, 112) and second test pads (106). The shape and layout of test pads 110 may vary with specific designs. For example, rectangular test pads are illustrated in the embodiments, but in practical application test pads may be disposed with circular, polygonal, or other shapes.

FIG. 4 illustrates a group of nine (9), rectangular first test pads 108 disposed in a central portion on the bottom of substrate 102. FIG. 5 shows other possible arrangements of bottom surface test pad groupings, including a 3×3 rectangular arrangement 108A, a 2×2 rectangular arrangement 108B, and a 1×2 linear arrangement 108C.

FIG. 6 is a flow chart summarizing a method of testing a semiconductor package having test pads on both surfaces of a substrate according to an embodiment of the invention.

Referring to FIG. 6, in the method, a semiconductor package consistent with an embodiment of the invention is loaded onto a specialized piece of test equipment referred to hereafter as "a tester" (S100). The tester may take many different forms but may be provided as a commercially available device or as a custom test set. Then, a connector for testing the semiconductor package is connected to the test pads disposed on the top and bottom surfaces of the substrate in order to perform electrical and functional testing (S110).

The test connector may take many different forms, but in one embodiment comprises a needle probe connected to the tester, and/or a POGO pin disposed in a socket. Certain test pads from a plurality of test pads associated with the semiconductor package are then covered with an insulating layer such as photo solder resist (PSR) (S120). The test pads selectively covered by the insulating layer may function of their relative height above a surface of the substrate, as well as the depth and viscosity of the applied insulating layer (i.e., certain first group test pads may be covered by the insulating layer while second group test pads having an attached solder ball or solder bump may remain uncovered).

FIG. 7 is a sectional view further illustrating a method of testing a semiconductor package having test pads on both surfaces of a substrate using an exemplary connector according to an embodiment of the present invention.

Referring to FIG. 7, the method of testing a semiconductor package having test pads on both surfaces of a substrate according to an embodiment of the invention is characterized by the use of a test connector including probe needles 212, 214, and 232 simultaneously connecting to test pads disposed on both surfaces, (i.e., top and bottom surfaces) of a substrate supporting a semiconductor package 100. Thus, the available test connection area provided by semiconductor package 100 is expanded without necessarily expanding the size of the substrate.

Further, the respective lengths of probe 212 connecting solder ball 114, probe 214 connecting test pad 108, and probe 232 connecting test pad 112 may be different. For example, probe 214 may be provided and arranged with a smaller relative pitch in comparison to the other probes. In FIG. 7, reference numeral 210 represents a lower probe card, a reference numeral 230 represents a top probe card, and a reference numeral 220 represents an interconnection between the top and lower probe cards. Interconnection 220 may be electrically connected to a tester, so that a process of testing electric functions of the semiconductor package 100 is performed.

Figure 8:
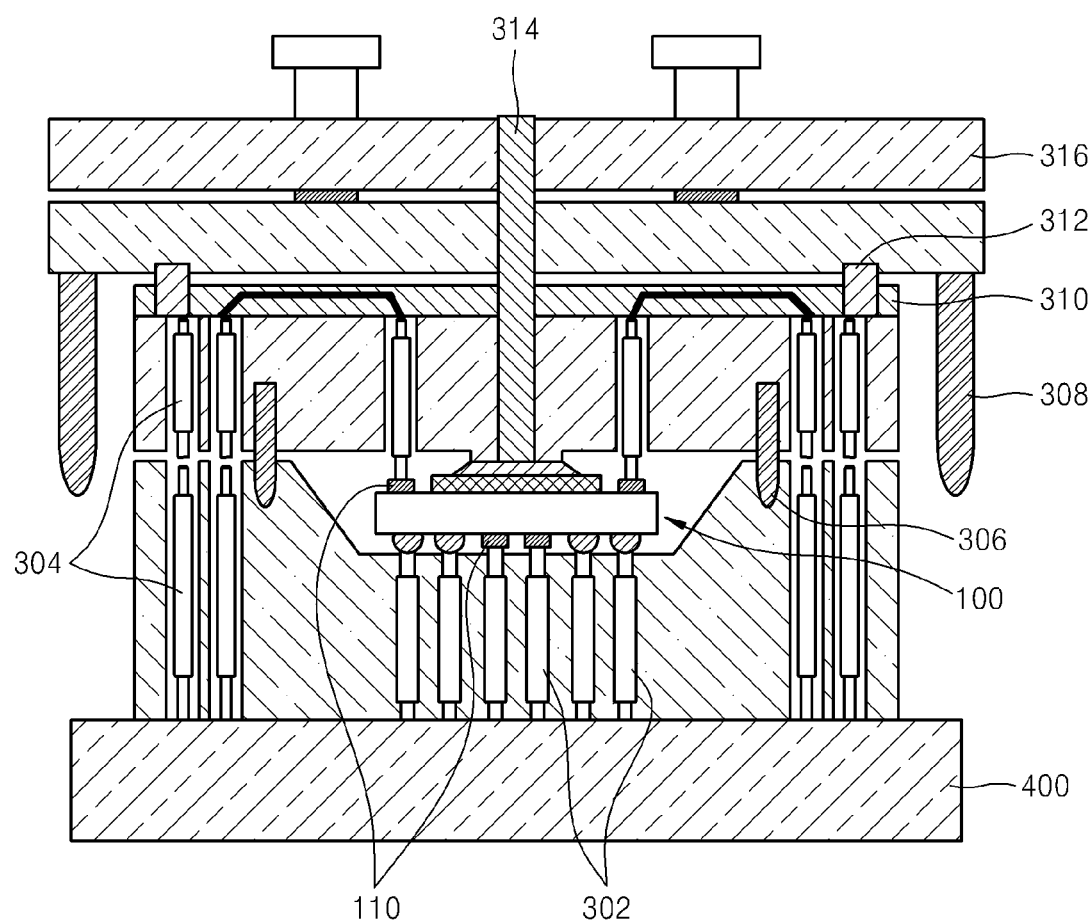
FIG. 8 is a sectional view illustrating a method of testing a semiconductor package having test pads on both surfaces of a substrate using a POGO pin test connection according to an embodiment of the invention.

FIG. 8 is a sectional view illustrating a method of testing a semiconductor package having test pads on both surfaces of a substrate using a POGO pin as a test connector according to an embodiment of the invention.

Referring to FIG. 8, the testing accomplished by probes in the embodiment of FIG. 7 may be similarly performed with sockets and corresponding POGO pins 302 and 304. Reference numeral 302 represents a POGO pin connecting the test pad 110 on a top surface of the substrate of the semiconductor package 100 to a test board 400, and reference numeral 304 is a POGO pin connecting a solder ball and a test pad 110 on bottom surface of the substrate of the semiconductor package 100 to the test board 400.

The socket in the illustrated example is composed of a housing 316 as a body, and the housing 316 is connected to a printed circuit board 310 via a bolt 312. Further, guide pins 306 and 308 being used for accurate arrangement are provided in the socket. Further, the semiconductor package 100 can be moved by means of vacuum force in a vacuum path 314 provided within the housing 316.

Those of ordinary skill in the art will recognize however that specific shapes and connection approaches contemplated by embodiments of the invention extend beyond the use of POGO pins and needle probes. Nevertheless, embodiments of the invention allow test only pads conventionally associated with solder balls to be replaced with naked test pads of significantly smaller dimensions. Such a varied arrangement may be provided on both surfaces (top and bottom) of a substrate supporting a semiconductor package.

Embodiments of the invention allow dual (or multiple) test connections rather that one way test connections that characterize the conventional test approaches. Thus, more test points may be accessed with greater efficiency.

While the present invention has been particularly shown and described with reference to exemplary embodiments thereof, it will be understood by those of ordinary skill in the art that various changes in form and details may be made therein without departing from the scope of the invention as defined by the following claims.

What is claimed is:

1. A method of testing a semiconductor package, wherein the semiconductor package comprises a substrate having top and bottom surfaces, a semiconductor chip mounted in a centrally located semiconductor chip mounting area of the substrate, and a plurality of test pads disposed on top and bottom surfaces of the substrate and comprising first test pads configured on the top and bottom surfaces of the substrate and having a first height above the respective top and bottom surface of the substrate, and second test pads disposed on the bottom surface of the substrate, wherein each of the second test pads attaches a solder ball such that a combination of the second test pads and attached solder ball has a second height above the bottom surface which is greater than the first height, wherein the first test pads on the bottom surface of the substrate are classified into a plurality of sub-groups, and wherein the second test pads are disposed on the bottom surface of the substrate in an evenly spaced array except that at least one of the second test pads in the array is replaced by the sub-groups of the first test pads;

wherein the method comprises:

loading the semiconductor package into a tester; and performing electrical/functional testing of the semiconductor package using a test connector simultaneously connecting to the plurality of test pads.

2. The method of claim 1, wherein the test connector comprises a POGO pin.

3. The method of claim 1, wherein the test connector is a probe needle.

4. The method of claim 3, wherein the test connector comprises:

a first probe of first length connected to one of the second test pads;

a second probe of second length connected to one of the first test pads disposed on the bottom surface of the substrate; and a third probe of third length connected to one of the first test pads disposed on the top surface of the substrate.

5. The method of claim 1, further comprising:

following completion of the electrical/functional testing of the semiconductor package, forming an insulating layer on at least the top surface of the substrate.

6. The method of claim 1, wherein the sub-groups comprises a first sub-group under the chip mounting area and a second sub-group under at least a portion of a peripheral area surrounding the chip mounting area.

7. The method of claim 1, wherein each of the first and second sub-groups of the first test pads includes two, three, four, or nine first test pads.

8. The method of claim 1, wherein the first test pads occupies a smaller area on the substrate than any one of the second test pads.

* * * * *